(12) United States Patent
Smith et al.

(10) Patent No.: US 11,356,122 B2
(45) Date of Patent: Jun. 7, 2022

(54) SYSTEMS AND METHODS FOR INTERLEAVED HAMMING ENCODING AND DECODING

(71) Applicant: Marvell Asia Pte Ltd., Singapore (SG)

(72) Inventors: Benjamin Smith, Ottawa (CA);
Volodymyr Shvydun, Los Altos, CA (US); Jamal Riani, Fremont, CA (US); Ilya Lyubomirsky, Santa Clara, CA (US)

(73) Assignee: Marvell Asia Pte Ltd., Singapore (SG)

( * ) Notice: Subject to any disclaimer, the term of this patent is extended or adjusted under 35 U.S.C. 154(b) by 53 days.

(21) Appl. No.: 16/818,864

(22) Filed: Mar. 13, 2020

(65) Prior Publication Data

US 2021/0288672 A1 Sep. 16, 2021

(51) Int. Cl.
*H03M 13/00* (2006.01)
*H03M 13/27* (2006.01)
*H03M 13/15* (2006.01)

(52) U.S. Cl.
CPC ... *H03M 13/2792* (2013.01); *H03M 13/1515* (2013.01); *H03M 13/2732* (2013.01)

(58) Field of Classification Search
CPC ......... H03M 13/2792; H03M 13/1515; H03M 13/2732
See application file for complete search history.

(56) References Cited

U.S. PATENT DOCUMENTS

| | | | | |
|---|---|---|---|---|
| 7,765,577 B2* | 7/2010 | Bhaskaran | ........ | H03M 13/2966 725/131 |
| 9,461,941 B2* | 10/2016 | Mehta | .................... | H04L 49/352 |
| 9,800,361 B2* | 10/2017 | Gareau | ................. | H04L 49/351 |
| 10,164,733 B2* | 12/2018 | Basso | ..................... | H04L 47/19 |
| 10,404,402 B2* | 9/2019 | Loprieno | ........... | H04B 10/6166 |
| 10,491,370 B2* | 11/2019 | Yang | ...................... | H04J 3/0658 |
| 2009/0077448 A1* | 3/2009 | Haas | ................. | H03M 13/2909 714/782 |
| 2010/0293433 A1* | 11/2010 | Limberg | ............... | H04L 1/0057 714/755 |

* cited by examiner

*Primary Examiner* — Esaw T Abraham

(57) ABSTRACT

A communication device includes a first alignment circuit configured to receive, from a host device, a first encoded data stream including a plurality of symbols encoded with a first type of error correction code. The first alignment circuit is configured to output an aligned first encoded data stream that is aligned to boundaries between the plurality of symbols encoded with the first type of error correction code. An interleaver is configured to interleave the plurality of symbols of the aligned first encoded data stream into symbol sections each including a predetermined number of symbols encoded with the first type of error correction code. An encoder is configured to generate, for each of the symbol sections, a parity block corresponding to the symbols in the symbol section and to output a second encoded data stream including the aligned first encoded data stream and the parity block.

17 Claims, 12 Drawing Sheets

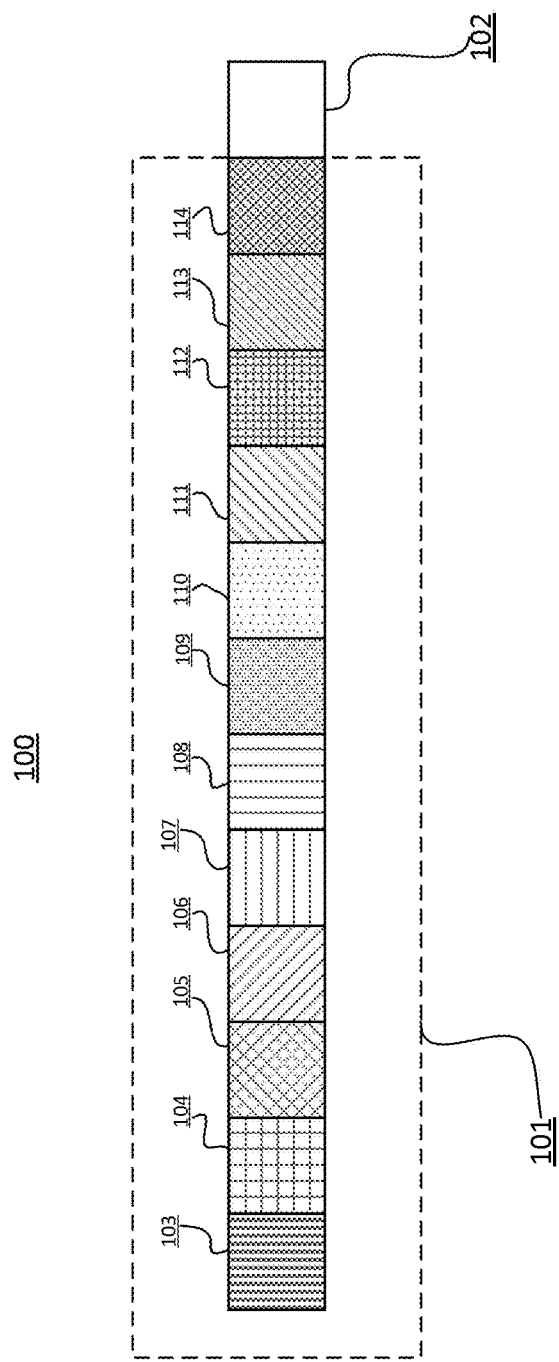

| Inner Code | Int+Deint 2*Block Latency [ns] | Baud Rate (400G) [Gbaud] | KP4+Hamming PAM4 Coding Gain[dB] @1e-15 | KP4+Hamming (Gray) PAM4 raw BER limit | KP4 + Hamming NCG [dB] | KP4+Hamming + iterative NCG [dB] |
|---|---|---|---|---|---|---|
| Ham(128,120) | 137 | 56.66 | 10.05 | 4.85E-03 | 9.51 | 10.11 |
| Ham(118,110) | 123 | 56.98 | 10.1 | 5.00E-03 | 9.54 | 10.14 |
| Ham(108,100) | 109 | 57.37 | 10.15 | 5.22E-03 | 9.56 | 10.16 |
| Ham(98,90) | 96 | 57.84 | 10.3 | 5.90E-03 | 9.68 | 10.23 |
| Ham(88,80) | 82 | 58.43 | 10.45 | 6.50E-03 | 9.78 | 10.33 |
| Ham(78,70) | 69 | 59.19 | 10.55 | 7.10E-03 | 9.82 | 10.37 |
| Ham(68,60) | 55 | 60.2 | 10.75 | 8.18E-03 | 9.95 | 10.45 |

Figure 2B

SYSTEMS AND METHODS FOR INTERLEAVED HAMMING ENCODING AND DECODING

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to data communication systems and techniques thereof.

Over the last few decades, the use of communication networks has exploded. In the early days of the Internet, popular applications were limited to emails, bulletin board, and mostly informational and text-based web page surfing, and the amount of data transferred was relatively small. Today, the Internet and mobile applications demand a huge amount of bandwidth for transferring photo, video, music, and other multimedia files. For example, a social network like Facebook processes more than 500TB of data daily. With such high demands on data storage and data transfer, existing data communication systems need to be improved to address these needs.

The rate of data communication can be improved in many ways, such as via error correction. For example, Reed-Solomon codes have been used in conventional communication systems. Unfortunately, existing techniques are inadequate and improved systems and methods are desired.

BRIEF SUMMARY OF THE INVENTION

The present invention is directed to data communication and encoding techniques. More specifically, an embodiment of the present invention provides a communication device that aligns a data stream with RS symbols. An interleaver interleaves RS symbols to generate an interleaved RS symbol data stream. Hamming parity blocks are generated for corresponding groups of RS symbols and inserted into the interleaved RS symbol data stream. There are other embodiments as well.

According to an embodiment, the present invention provides a communication device, which includes an m number of communication lanes including a first communication lane configured to receive a first encoded data stream. The device further includes a first alignment module configured to align the first encoded data stream to output aligned Reed-Solomon (RS) symbols. The device also includes a convolutional interleaver configured to interleave the aligned RS symbols into RS symbol sections. Each of RS symbol sections consists of n RS symbols. The device additionally includes an encoder configured to generate Hamming parity blocks corresponding to the RS symbol sections and to output a first Hamming encoded data stream. The device further includes a distribution block for distributing m Hamming encoded data streams to k physical channels. The m Hamming encoded data streams include the first Hamming encoded data stream.

According to another embodiment, the present invention provides a method for encoding a data stream. The method includes receiving a first encoded data stream, which comprises a plurality of Reed-Solomon (RS) symbols. The method also includes aligning the first encoded data stream based on boundaries of RS symbols to generate a first aligned RS symbol stream. The method further includes interleaving the first aligned RS symbol stream into RS symbol sections. Each of the RS symbol sections consists of n RS symbols. The method additionally includes performing inner FEC encoding on the first aligned RS symbol stream to generate a first inner FEC encoded stream, which includes inner FEC parity blocks corresponding to RS symbol sections. The method additionally includes distributing m inner FEC encoded streams to k physical channels. The m inner FEC encoded data streams includes the first inner FEC encoded stream.

According to yet another embodiment, the present invention provides a method for decoding a data stream with interleaved Hamming codewords. The method includes receiving a hard-decoding input and associated reliabilities for each received bit, with reliabilities expressed as log-likelihood ratios (LLR). The method also includes calculating a syndrome portion and an overall parity check bit for each interleaved Hamming codeword. The method further includes providing an odd error correction map and an even error correction map. The method includes selecting between the odd error correction and the even error correction map based on the overall parity bit. The method also includes flipping one or more bits from the hard-decoding input and using a selected error correction map and the value of the syndrome portion to determine a candidate codeword. The position of bits flipped prior to decoding corresponds to different combinations of the least reliable received bits. The decoded codeword is the candidate codeword with the smallest sum of LLR magnitudes in the positions inverted with respect to the hard-decoding input.

It is to be appreciated that embodiments of the present invention provide many advantages over conventional techniques. Among other things, encoder and decoder modules according to embodiments of the present invention can be easily adopted into existing systems. For example, in a PAM4 based high-speed data communication systems, interleaver and Hamming encoder and decoder modules add onto existing communication chips with RS encoding scheme. The addition of Hamming parity block for interleaved RS symbols according to embodiments of the present invention adds little transmission overhead (8/128), and low-power implementation can be achieved. With interleaving mechanism, interleaved Hamming parity blocks can be used in different data transmission modes, including but not limited to 50G, 100G, 200G, and 400G modes.

Embodiments of the present invention can be implemented in conjunction with existing systems and processes. For example, Hamming code based error check and correction can be easily adapted into existing communication system. Encoding and decoding modules according to embodiments of the present invention can be readily manufactured using existing manufacturing processes and systems. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 1 is a block diagram illustrating an FEC coding scheme according to an embodiment of the present invention.

FIG. 2B is a table illustrating coding performance according to embodiments of the present invention.

DETAILED DESCRIPTION OF THE INVENTION

Figure 2A:
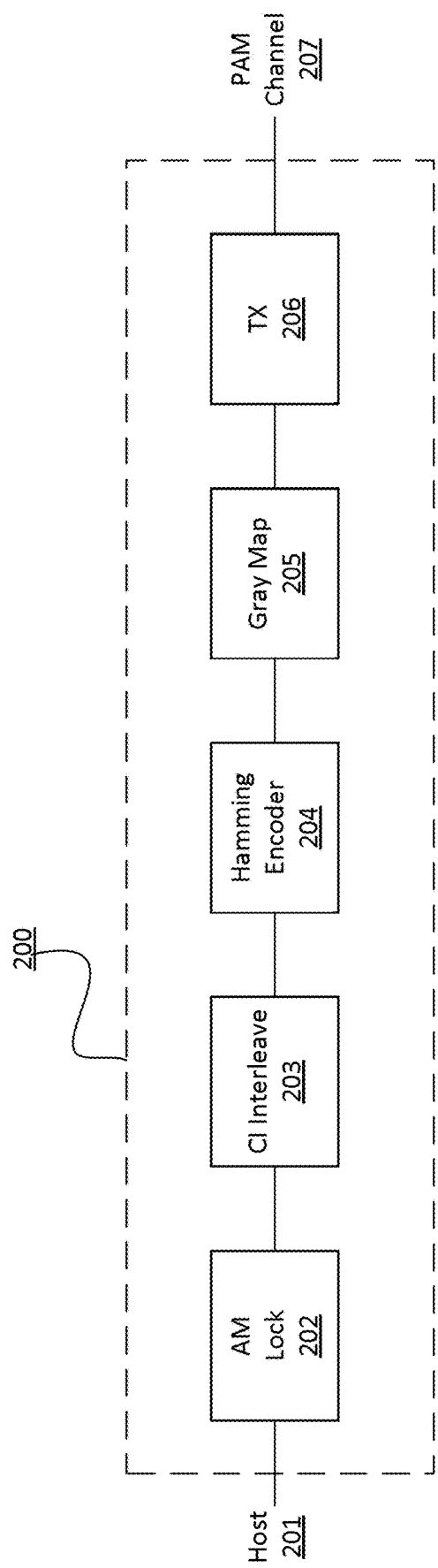
FIG. 2A is a simplified diagram illustrating a communication device according to an embodiment of the present invention.

The present invention is directed to data communication and encoding techniques. More specifically, an embodiment of the present invention provides a communication device that aligns a data stream with RS symbols. An interleaver interleaves RS symbols to generate an interleaved RS symbol data stream. Hamming parity blocks are generated for corresponding groups of RS symbols and inserted into the interleaved RS symbol data stream. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object.

FIG. 1 is a block diagram illustrating an FEC coding scheme according to an embodiment of the present invention. This diagram is merely an example, which should not unduly limit the scope of the claims. One of ordinary skill in the art would recognize many variations, alternatives, and modifications. An encoded data stream 100 includes a data section 101 and a Hamming parity block 102. In a specific embodiment, the data section 101 includes 12 Reed-Solomon (RS) symbols 103-114. Each of the RS symbols (i.e., blocks 103-114) contains 10 bits of data. For example, each of the RS symbols is from a distinct codeword (e.g., as generated in a FEC encoding process and a codeword interleaver). Hamming parity block 102 includes 8 bits of Hamming data corresponding to RS symbols 103-114. For example, "Hamming parity block" refers to a parity block generated by Hamming encoding, and "Hamming codeword" refers to a codeword having a data section of RS symbols (e.g., block 101) and a Hamming parity block (e.g., block 102). For example, the 8 bits of parity data contained in Hamming parity block 102 correspond to the parity block of an 8-bit extended Hamming error-correction code. As a part of the data stream 100, a Hamming codeword includes data section 101 and Hamming parity block 102. It is to be appreciated that the Hamming parity bits stored in Hamming parity block 102, provide a significant improvement in overall coding gain (e.g., close to 10 dB overall coding gain in certain implementations) and admit a simple soft-decision decoding algorithm. For example, data stream 100 includes a repeating Hamming codewords, which forms a pattern of 12 RS symbols (10 bits each) followed by a Hamming parity block (8 bits). In various applications, a Hamming decoding failure would only result in at most one RS symbol error per RS codeword. In some communication systems and applications, a different and separate forward error correction (FEC) process (e.g., hard FEC) is performed in addition to the process of generating the Hamming parity block 102.

As an example, the coding scheme illustrated in FIG. 1 is implemented into a communication system. FIG. 2A is a simplified diagram illustrating a communication device according to an embodiment of the present invention. This diagram is merely an example, which should not unduly limit the scope of the claims. One of ordinary skill in the art would recognize many variations, alternatives, and modifications. A communication device 200 includes functional blocks 202-206 as shown. For example, functional blocks 202-206 are configured to process data from a single 25G FEC lane. Data received from host 201 is processed at AM lock block 202. For example, the communication device may be connected to host 201 via more than one physical communication links. In various embodiments, host 201 as shown transmit RS symbols (i.e., RS encoding is performed at the host side) via FEC lanes to the communication system, as received by AM lock block 202. In certain embodiments, host 201 periodically inserts alignment markers (AM) in the 25G FEC lanes, between blocks of RS symbols. In certain embodiments, the RS symbols received by the AM lock block 202 have already been two-way interleaved. AM lock block 202 detects and locks onto the AMs, and aligns the received data to the boundaries of RS symbols. Block 203 interleaves the aligned data using a convolutional interleaving (CI) process, in which the frame data may be interleaved six-way (the received RS symbols already being two-way interleaved) or twelve-way. Hamming encoder 204 performs encoding to insert Hamming parity data (e.g., an 8-bit Hamming parity block) into the RS data stream. For example, Hamming encoder 204 generates the data stream 100 illustrated in FIG. 1, where an 8-bit Hamming parity block is generated for 12 interleaved RS symbols. The RS symbol data stream, now embedded with Hamming parity blocks, is then processed at block 205, where Gray mapping is performed. The mapped data is transmitted by transmitter 206 via the pulse-amplitude modulation (PAM) channel 207. For example, in 100G communication, four 25G FEC data streams are received from host 201 and later combined (e.g., at transmission channel 207) for 100G communication. It is to be understood that the communication device may include multiple communication lanes. For example, there might be multiple data streams processed by multiple AM lock blocks, convolutional interleavers, RS encoders, and Hamming encoders in parallel. In various embodiments, BCH (n, k, t) encoding, instead of Hamming encoding, is used to encode the RS symbols. For example, BCH encoding is equivalent to Hamming encoding when t=1. In various embodiments, BCH encoding is performed over interleaved RS symbols (e.g., similar to the Hamming encoding process described above), wherein the BCH payload is n*10 bits for n RS symbols originated from distinct RS codewords. As an example, both BCH encoding and Hamming encoding can be referred to as "inner FEC" processes, to differentiate from FEC encoding of RS symbols.

FIG. 2B is a table illustrating coding performance according to embodiments of the present invention. This diagram is merely an example, which should not unduly limit the scope of the claims. One of ordinary skill in the art would recognize many variations, alternatives, and modifications. Depending on the implementation, various types of Hamming code schemes may be used. For example, the scheme Ham (128, 120) involves a relatively small coding overhead (i.e., 8 bits of error correction information corresponding to 120 bits of data payload), but since the inner code is relatively long at 128 bits, this scheme involves the longest latency of 137 ns as shown. In comparison, scheme Ham (68, 60) involves a relatively bigger overhead (i.e., 8 bits of error correction information corresponding to 60 bits of data payload) that is about twice as the Ham (128, 120) scheme, it has much lower latency and greater coding gain. In a specific embodiment, a coding scheme according to the present invention provides an 8-bit Hamming block for 6 RS symbols (e.g., each RS symbol is a 10-bit codeword), and the data rate characteristics would follow the Ham (68, 60) scheme. Depending on the implementation, different coding schemes may be used.

Figure 3:
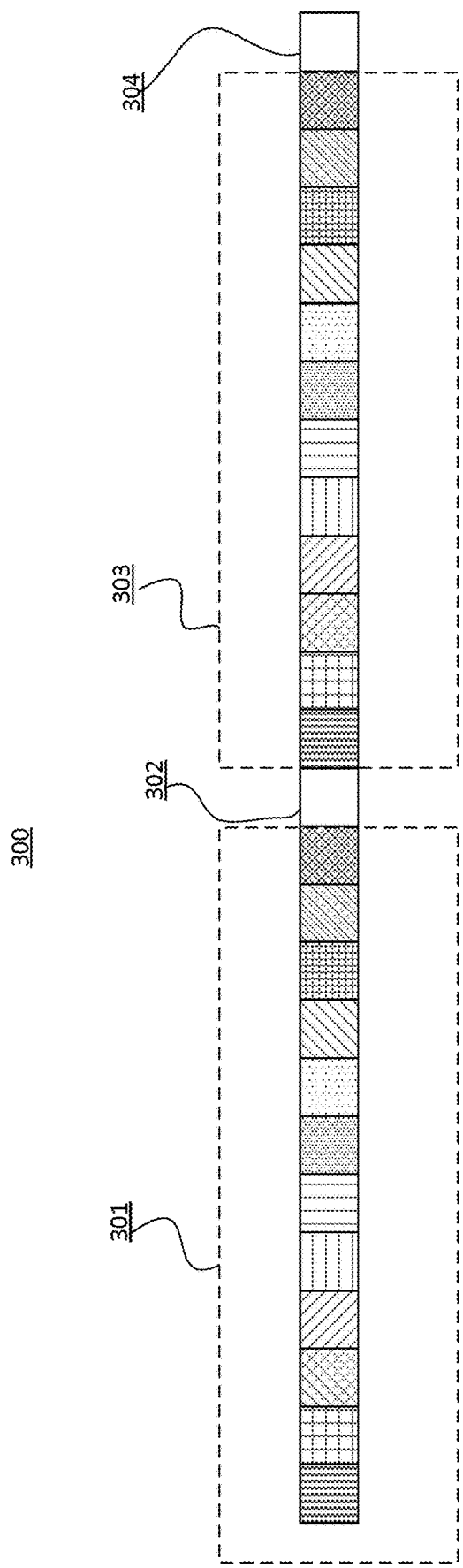
FIG. 3 is a block diagram illustrating the combination of encoded data streams according to an embodiment of the present invention.

FIG. 3 is a block diagram illustrating the combination of encoded data streams according to an embodiment of the present invention. This diagram is merely an example, which should not unduly limit the scope of the claims. One of ordinary skill in the art would recognize many variations, alternatives, and modifications. Data stream 300 includes an RS symbol section 301 followed by Hamming parity block 302, generated from a first processed FEC lane. RS symbol section 301 includes 12 RS symbols. For example, these 12 RS symbols are generated by a 12-way RS codeword interleaving structure. Hamming parity block 302 includes 8 bits of Hamming parity, which can be in a Ham (128, 120) scheme, corresponding to the 12 RS symbols. Hamming parity block 302 is followed by RS symbol section 303, which includes 12 RS symbols. It is to be noted that the RS symbols in RS symbol section 303 are interleaved in the same order as the RS symbols in RS symbol section 301. Similarly, Hamming parity block 304 contains 8 bits of Hamming parity for the 12 RS symbols in the RS symbol section 303, generated from a second processed FEC lane. Data stream 300 as shown includes two Hamming codewords: a first Hamming codeword consisting of data section 301 and Hamming parity block 302, and a second Hamming codeword consisting of data section 303 and Hamming parity block 304. Data stream 300 illustrates an ideal scenario, where RS symbols from distinct processed FEC lanes remain 12-way interleaved at Hamming codeword boundaries.

Figure 4:
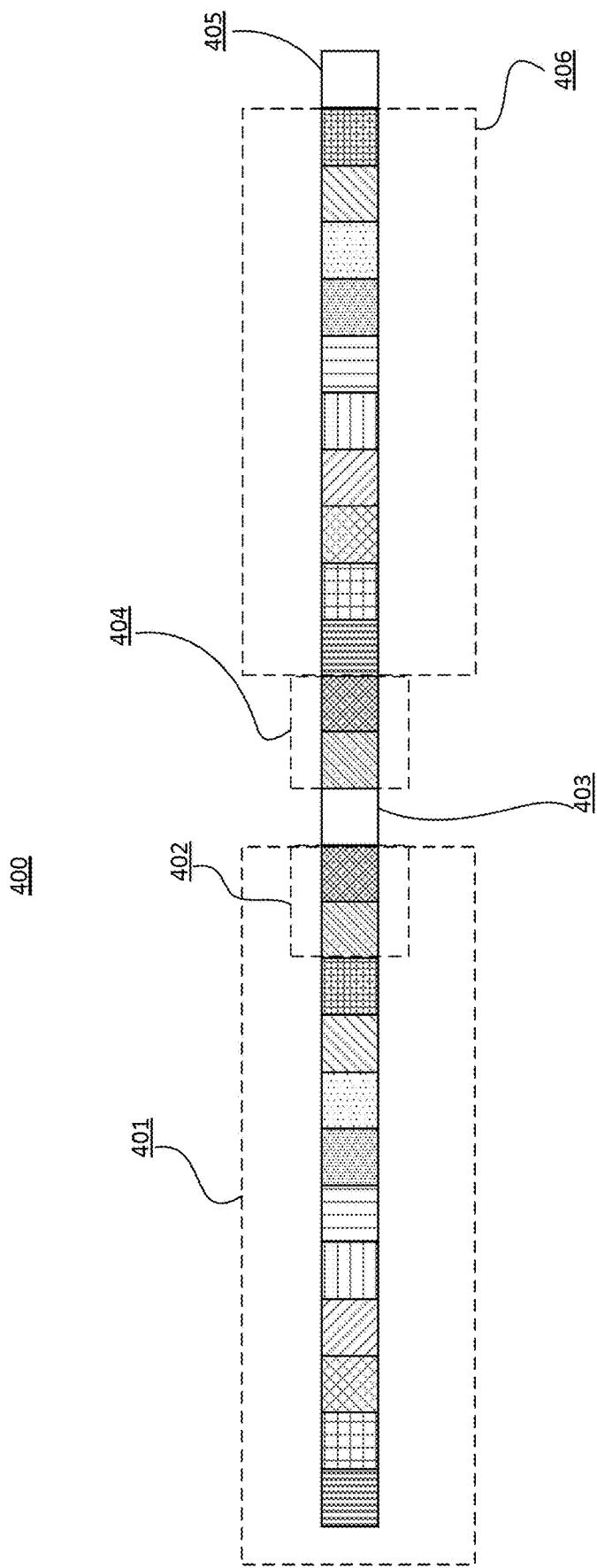
FIG. 4 is a block diagram illustrating sub-optimal interleaving at the boundary between Hamming codewords from a combination of encoded data streams, according to embodiments of the present invention.

FIG. 4 is a block diagram illustrating sub-optimal interleaving at the boundary between Hamming codewords from a combination of encoded data streams, according to embodiments of the present invention. This diagram is merely an example, which should not unduly limit the scope of the claims. One of ordinary skill in the art would recognize many variations, alternatives, and modifications. Data stream 400 includes RS symbols blocks followed by corresponding Hamming parity blocks. For example, RS symbol section 401 includes 12 RS symbols (e.g., according to a predetermined interleaving scheme). The two RS symbols in section 402 is a portion of the 12-symbols section 401. For example, these two RS symbols are next to each due to a two-way interleaving process performed by a host. Hamming parity block 403 contains 8-bits of Hamming codes and corresponds to the 12 RS symbols in section 401. Section 401 and Hamming parity block 403 form a first Hamming codeword. In various situations, due to skew introduced during data transmission (e.g., data transmitted at high speed being misaligned between 25G FEC lanes), 12-way interleaving of RS symbols is not maintained at the boundary between RS symbol sections 401 and 406, which originate from distinct FEC lanes. Among other things, the scenario illustrated in FIG. 4 reduces the burst tolerance of the system. In various embodiments, de-skewing mechanism is used to address the misalignment problem illustrated in FIG. 4.

Figure 5:
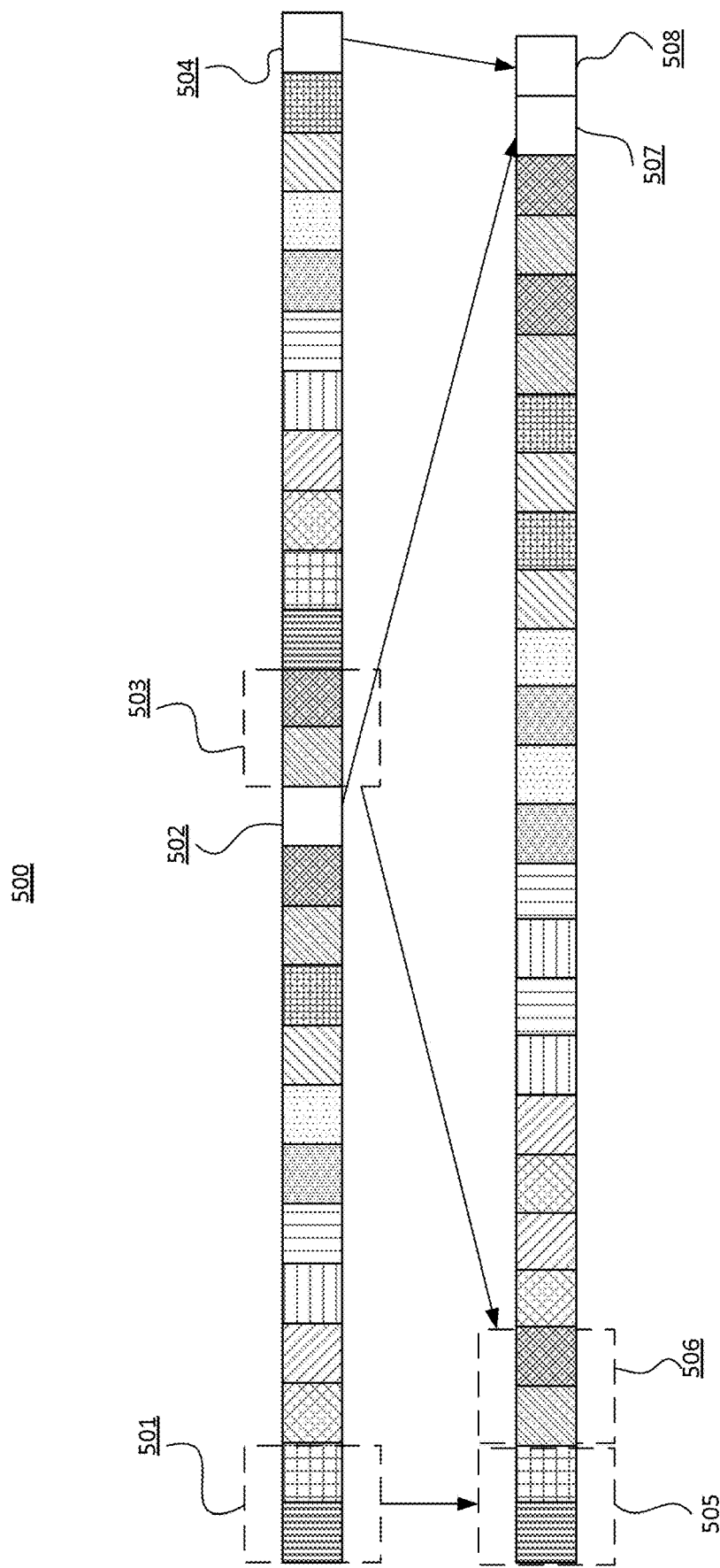
FIG. 5 is a block diagram illustrating an interleaving FEC coding scheme according to an embodiment of the present invention.

FIG. 5 is a block diagram illustrating an interleaving FEC coding scheme according to an embodiment of the present invention. This diagram is merely an example, which should not unduly limit the scope of the claims. One of ordinary skill in the art would recognize many variations, alternatives, and modifications. In FIG. 5, Hamming codewords are interleaved. Without the two-way interleaving (i.e., an interleaving process separate from the 12-way interleaving of RS symbols), Hamming parity block 502 includes 8 bits of Hamming code information for the previous 12 RS symbols (with section 501 as the first two RS symbols), and Hamming parity block 504 similarly includes 8 bits of Hamming code information for the previous 12 RS symbols (with section 503 as the first two RS symbols). In a two-way Hamming codeword interleaving scheme, two RS symbols sections, each containing 12 RS symbols, are interleaved two RS symbols at a time. RS section 501 and RS section 503 are interleaved to become the first four RS symbols (as sections 505 and 506 as shown) of the long RS symbol section formed by the two-way interleaving process. Hamming parity block 502 is interleaved to position 507. Hamming parity block 504 is interleaved to position 508. The two Hamming parity blocks 507 and 508 are next to each other after interleaving. It is to be understood that the two-way interleaving in FIG. 5 merely serves as an example. Hamming codewords can be interleaved in other ways as well prior to transmission over a physical data channel. One of the benefits for using the two-way interleaving scheme is that the system is more resilient to correlated pairs of error bits, since they will tend to be distributed over multiple Hamming codewords.

In practice, there are various limitations and constraints, such as latency and power. To address different scenarios, the implementation of soft decoder for a Hamming code can be based on the modeling of communication models. For example, using an additive white Gaussian noise (AWGN) model, which mimics the effects of many random processes that occurs in nature, the Hamming code is decoded using soft information, such as log likelihood ratio (LLR), in which the decoding algorithm assumes independent identically distributed (IID) bit errors.

In certain situations, correlated pair of errors can be a problem. For example, if a significant fraction of the errors occurs in pairs, such as situations involving maximum likelihood sequence estimation (MLSE) or decision-feedback equalization (DFE) encoding, the performance of Hamming decoding could be degraded. Interleaving multiple Hamming codewords on the line side reduces the probability that both errors hit the same Hamming codeword.

Figure 6A:
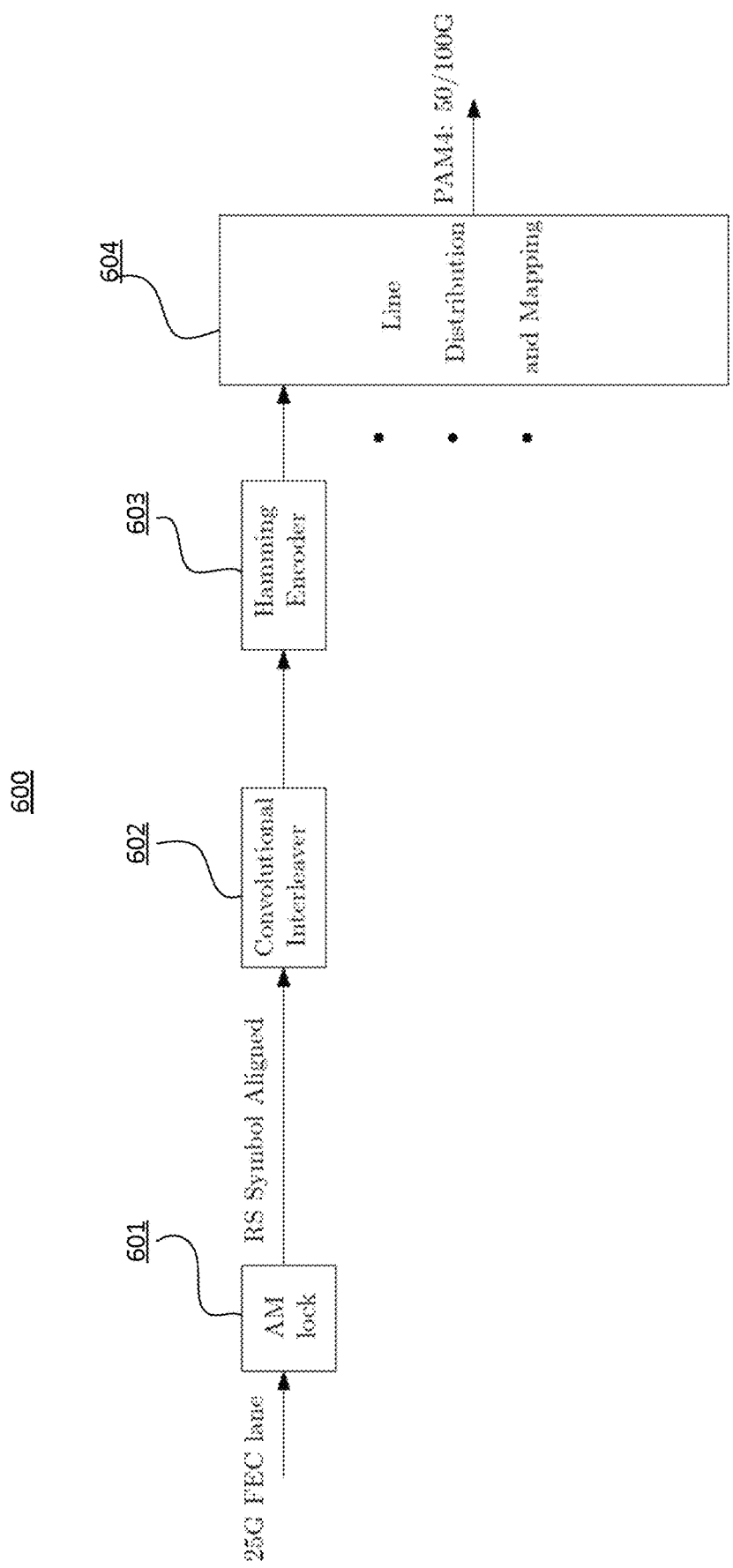
FIG. 6A is a block diagram illustrating a communication device according to an embodiment of the present invention.

FIG. 6A is a block diagram illustrating a communication device 600 according to an embodiment of the present invention. This diagram is merely an example, which should not unduly limit the scope of the claims. One of ordinary skill in the art would recognize many variations, alternatives, and modifications. For the purpose of illustration, communication device 600 presumably does not perform de-skewing of 25G FEC lanes, and the implication of this presumption is that to ensure 12-way RS symbol interleaving inside Hamming payload, interleaving and encoding processes are separately performed on each FEC lane. The communication device 600 includes multiple (m number of lanes) data paths that each includes its own functional blocks 601-603, whose data output is processed and distributed at block 604. For example, in a 100G communication mode, data from four (m=4) 25G FEC lanes are processed in parallel for the purpose of AM lock, interleaving, and Hamming encoding, the four data streams (each with their own Hamming parity blocks inserted into the respective data stream) are distributed at block 604 for 100G communication. For the purpose of interleaving and Hamming encoding, the four 25G FEC lanes are independent and no de-skewing process is required between the four lanes. If the communication device 600 is configured to perform 400G communication, there would be 16 lanes (25G each) from the input side.

As shown in FIG. 6A, data from a 25G FEC lane are first processed by the AM lock block 601. In various embodiments, AM lock block 601 aligns, using the embedded alignment markers, the data stream received from the FEC lane. For example, alignment markers in the FEC lane are detected and used to determine and align to RS symbol boundaries. For two-way KP4 interleaved FEC lanes, the RS symbols are aligned based on 20-bit boundaries. For KP4 FEC lanes without interleaving, the RS symbols are aligned on 10-bit boundaries, as convolutional interleaver can be designed to perform 12-way interleaving of 10-bit symbols.

Figure 7:
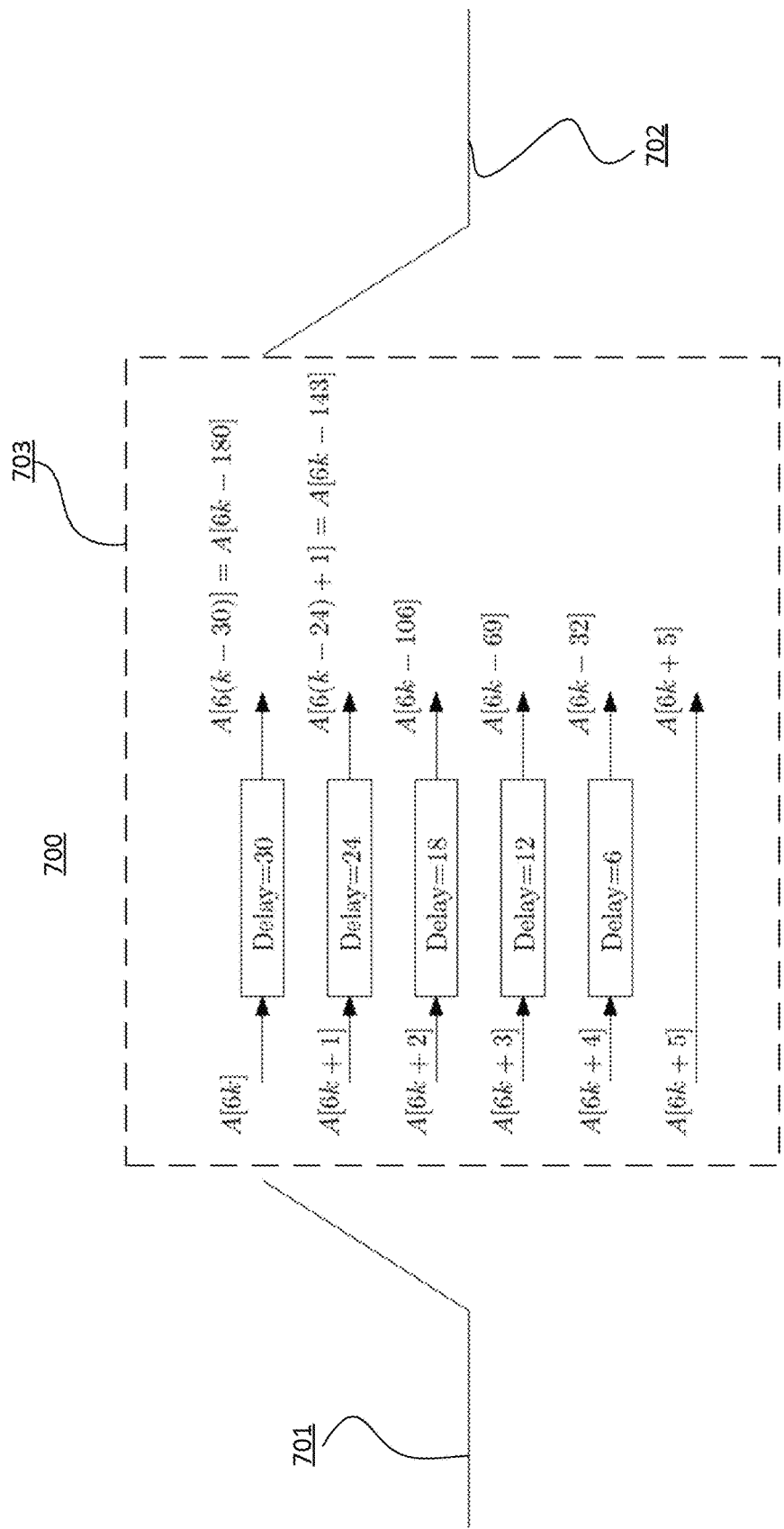
FIG. 7 is a simplified diagram illustrating an interleaving mechanism for a 400G communication interface according to an embodiment of the present invention.
Figure 10:
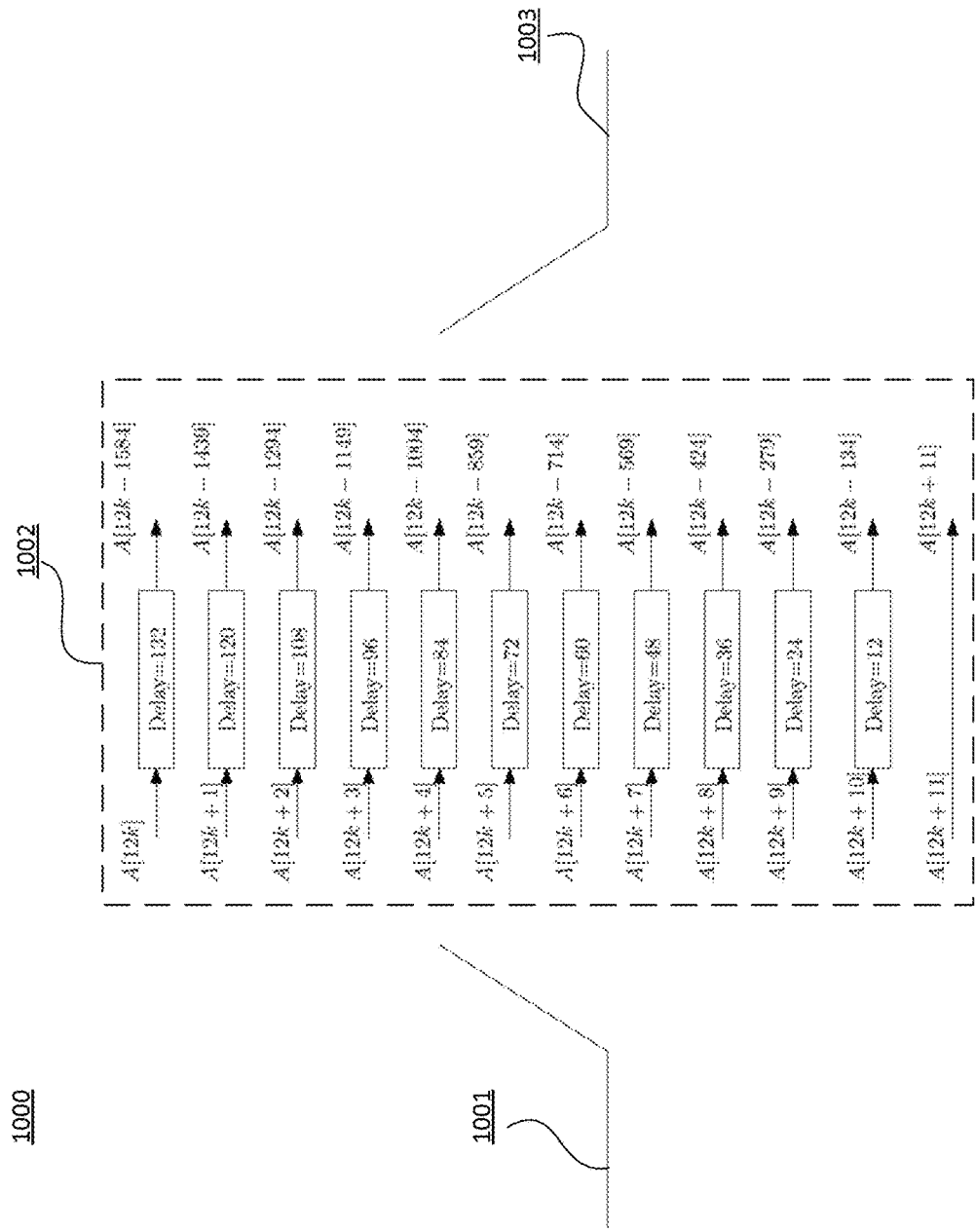
FIG. 10 is a simplified diagram illustrating a one-way interleaving mechanism for a 100G communication interface according to an embodiment of the present invention.

The aligned RS symbols are interleaved at block 602. In a specific embodiment, block 602 includes a convolutional interleaver that interleaves RS symbols 12-ways, thereby generating the RS symbol sections as illustrated in FIG. 1. Block 602 minimizes the latency in the interleaving process, which for the 120-bit payload (i.e., 12 blocks of 10-bit symbols) of Hamming encoder, the payload of 12 RS symbols comes from 12 distinct RS codewords. For example, it is understood that each of the FEC lane arrangements (e.g., 100G 1-way, 100G 2-way, 200G, and 400G) has a different number of RS symbols per FEC lane. In various embodiments, a Hamming encoding scheme according to the present invention is to generate an 8-bit Hamming parity block for 12 distinct RS symbols, and when data received from the host is already two-way interleaved, block 602 only needs to perform six-way interleaving, not twelve-way interleave. As explained below, interleaving scheme of block 602 largely depends on the incoming data stream (e.g., FIG. 7 shows six-way interleaving, and FIG. 10 shows 12-way interleaving).

Block 603 performs Hamming encoding. For example, an 8-bit Hamming parity block is generated for an RS symbol section that contains 12 RS symbols. The interleaved RS symbols, now with embedded Hamming parity blocks, form a data stream of Hamming codewords (i.e., each Hamming codeword consists of interleaved RS symbols and the corresponding Hamming parity block) that is processed at block 604. As mentioned above, device 600 includes multiple 25G FEC lanes that are processed by their corresponding blocks 601-603. For example, in an arrangement for PAM4 communication with 50G/100G output, block 604 receives data (already interleaved and Hamming encoded) from four 25G FEC lanes and performs data distribution and mapping as shown. Device 600 does not perform deskewing as explained above.

As an example, for a 100G lane, four processed 25G FEC lanes are combined, and Hamming codewords from the four FEC lanes are distributed in a round-robin fashion. For example, block 604 sequentially transmits 128 bits of data from the first FEC lane and its corresponding Hamming encoder, the 128 bits of data from the second FEC lane and its corresponding Hamming encoder, and 128 bits of data from the third FEC lane and its corresponding Hamming encoder, and the 128 bits of data from the fourth FEC lane and its corresponding Hamming encoder. Similarly, for 50G lane output, two FEC lanes are combined and distributed in a round-robin fashion.

Block 604 additionally maps pairs of bits for PAM4 communication. Depending on the implementation, optional 1/(1+D) modulo-4 precoder is used after PAM4 mapping.

It is to be appreciated device 600 is flexible and can operate in various modes. For example, device 600 can operate in 100G PCS mode (e.g., with or without 2-way KP4 interleaving), 200G PCS mode, and 400G PCS mode. Each of these four data communication modes is implemented with a specific convolutional interleaver. For example, there may be different hardware chips for performing different types of convolutional interleaving processes. In a digital implementation, different types of convolutional interleaving processes are performed by the same hardware chip but with different software algorithms. The same Hamming encoding scheme can be used for these four modes. In implementations of 50G or 100G PAM4 lanes, different numbers of FEC lanes may be combined, with optional Hamming parity blocks interleaved per FEC lanes. For example, for 100G communication (with a 100G output from block 604), four 25G FEC lanes at the input are processed and combined; for 400G communication, 16 (m=16) FEC lanes (25G each) at the input are combined and distributed at block 604 (i.e., combined to four output lanes if each output physical lane is 100G, or combined to a single output lane if the output physical lane is 400G).

Figure 6B:
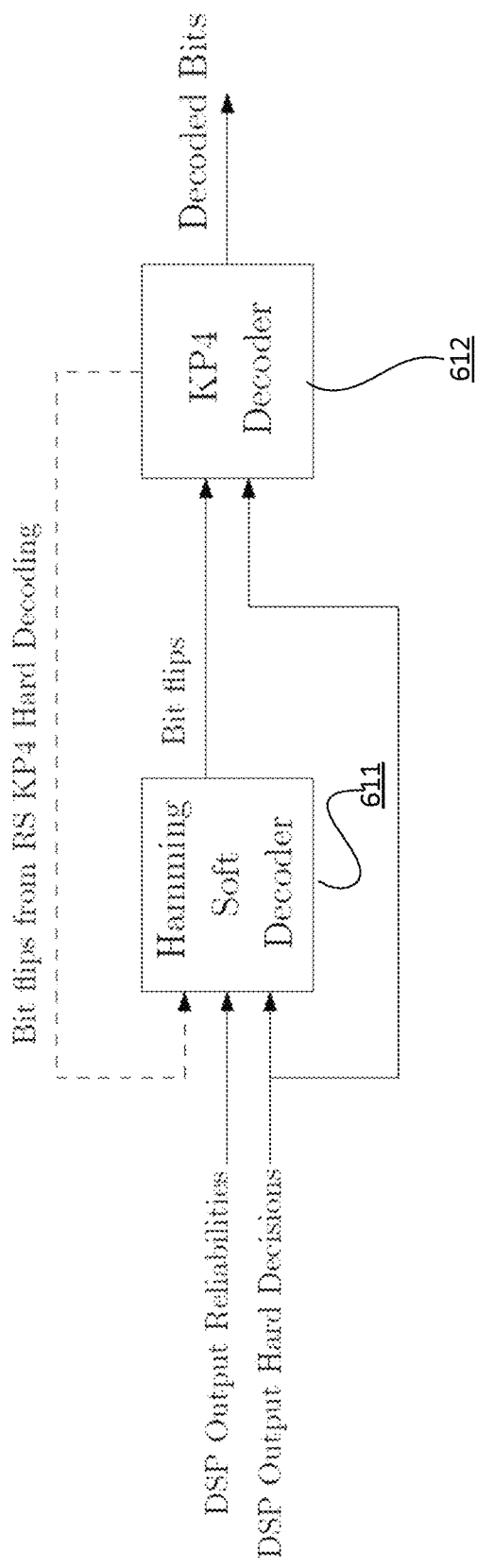
FIG. 6B is a block diagram illustrating a decoding device according to an embodiment of the present invention.

FIG. 6B is a block diagram illustrating a decoding device 610 according to an embodiment of the present invention. This diagram is merely an example, which should not unduly limit the scope of the claims. One of ordinary skill in the art would recognize many variations, alternatives, and modifications. Decoding device 601 includes Hamming soft decoder 611 and KP4 decoder 612. The inputs of block 611, as shown, includes DSP outputs related to communication link reliabilities and hard decisions, and block 611 additionally uses output of KP4 decoder 612 to generate bit flips. For example, block 611 uses bit flips from RS KP4 hard decoding provided by KP4 decoder 612 to determine bit flips. In various embodiments, KP4 decoder 612 includes a conventional hard decision algebraic decoder, and it outputs decoded bits. For example, decoding device 610 performs iterative decoding process. For example, if process for decoding RS codewords fails, one iteration of decoding is performed. Bit flips from successfully decoded RS codewords are communicated back to the Hamming code soft decoder 611. For example, reliabilities for bits corrected by the RS decoder are set to "INF", but other updates to soft reliabilities are not performed. The Hamming soft decoding process is repeated, and the failed RS symbols are decoded again.

FIG. 7 is a simplified diagram illustrating an interleaving mechanism for a 400G communication interface according to an embodiment of the present invention. This diagram is merely an example, which should not unduly limit the scope of the claims. One of ordinary skill in the art would recognize many variations, alternatives, and modifications. Interleaver 700 performs convolutional interleaving process with six data lanes with varying delays, and the delays are predetermined based on the data rate for 400G communication. As an example, input switch 701 is synchronized relative to the incoming data stream, and it is also synchronized relative to the output switch 702. Depending on the implementation, input switch 701 may be synchronized relative to AM positions. In various embodiments, synchronization at output switch 702 is implied by boundaries of Hamming parity blocks. In FIG. 7, RS code symbols are interleaved as 20-bit data blocks, which are two RS symbols coming from two distinct RS codewords. A block A[m] represents a block of two 10-bit RS symbols. For example, block A[6k] corresponds to the first set of two-way interleaved RS symbols, and block A[6k+1] represents the next two RS symbols after the first set of two RS symbols, and so on. For the purpose of six-way interleaving as shown, the interleaving delay lanes 703 have different amounts of delay (e.g., 30 units for A[6k] and no delay for A [6k+5]). For example, each of the delay lanes includes a multitude of serially cascaded 20-bit buffers, one per unit of delay, for temporarily storing sets of two RS symbols. Delay lanes 703 include six branches with varying delays (including zero delay) corresponding to six-way interleaving of two-way interleaved RS symbols, and the output of interleaver 700 is the 12-way RS interleaved data stream that forms the payload of the Hamming codewords. For example, output payload for generating Hamming parity block is (A[6k−180], A[6k−143], A[6k−106], A[6k−69], A[6k−32], A[6k+5]).

Figure 8:
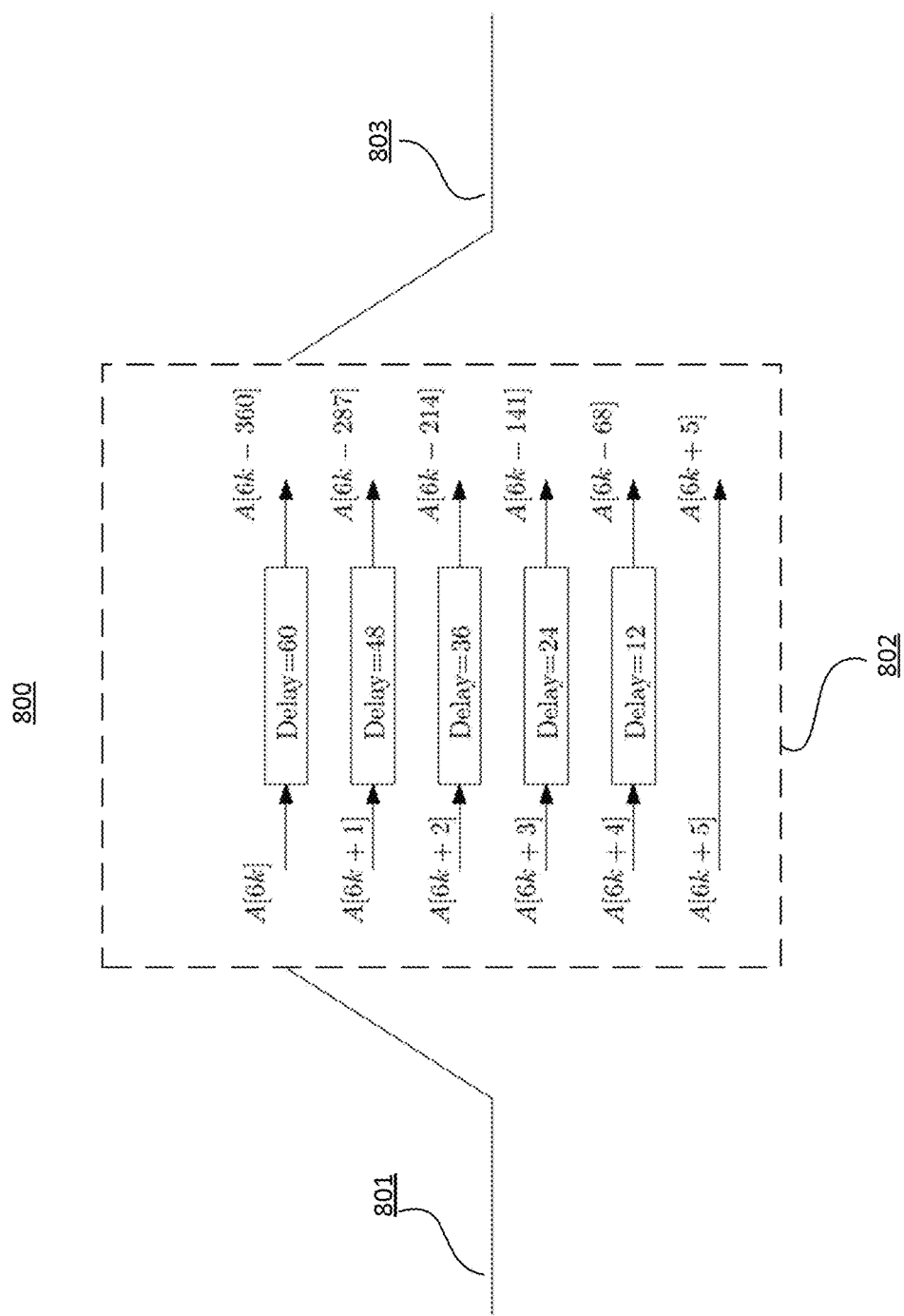
FIG. 8 is a simplified diagram illustrating an interleaving mechanism for a 200G communication interface according to an embodiment of the present invention.

FIG. 8 is a simplified diagram illustrating an interleaving mechanism for a 200G communication interface according to an embodiment of the present invention. This diagram is merely an example, which should not unduly limit the scope of the claims. One of ordinary skill in the art would recognize many variations, alternatives, and modifications. Interleaver 800 performs convolutional interleaving process with six data lanes with varying delays, and the delays are predetermined based on data rate for 200G communication. A data stream with two-way interleaved RS symbols is received at input 801, which distributes the received data streams six-ways into delay lanes. In various embodiments, input 801 distributes two-way interleaved RS symbols in 20-bit blocks (one RS symbol per interleaved RS codeword) to the six delay lanes as shown. For example, the 20-bit blocks of RS symbols are represented by A[M]. For example, block A[6k] corresponds to the first set of two-way interleaved RS symbols, and block A[6k+1] represents the next set of two-way interleaved RS symbols after the first set. For the purpose of six-way interleaving as shown, the interleaving delay lanes 803 have different amounts of delay (e.g., 60 units for A[6k] and zero delay for A[6k+5]). Note that there is a delay of 60 units for A[6k], whereas delay is 30 units for A[6k] in FIG. 7, and the difference is due to different data communication modes (i.e., 200G vs. 400G). Output 803 provides an interleaved data stream ready for Hamming encoding that follows, and the payload for Hamming encoding is (A[6k−360], A[6k−287], A[6k−214], A[6k−141], A[6k−68], A[6k+5]).

Figure 9:
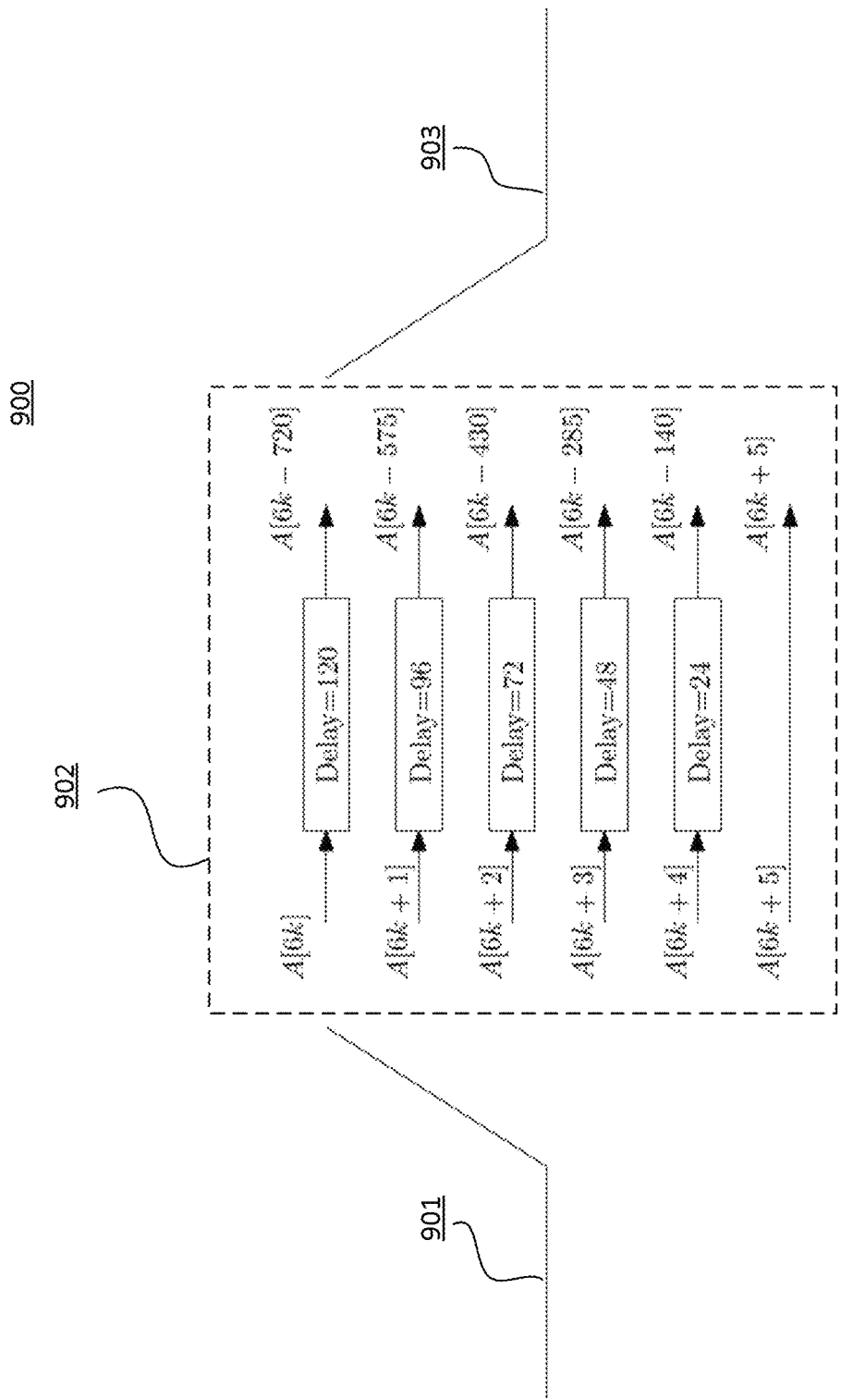
FIG. 9 is a simplified diagram illustrating a two-way interleaving mechanism for a 100G communication interface according to an embodiment of the present invention.

FIG. 9 is a simplified diagram illustrating a two-way interleaving mechanism for a 100G communication interface according to an embodiment of the present invention. This diagram is merely an example, which should not unduly limit the scope of the claims. One of ordinary skill in the art would recognize many variations, alternatives, and modifications. Interleaver 900 performs convolutional interleaving process with six data lanes with varying delays, and the delays are predetermined based on data rate for 100G communication (with two-way interleaved KP4 FEC lanes). A data stream with two-way interleaved RS symbols is received at input 901, which distributes the received data streams six-ways into delay lanes. In various embodiments, input 901 distributes RS symbols in 20-bit blocks to the six delay lanes as shown. For example, the 20-bit blocks of two-way interleaved RS symbols are represented by A[M]. For example, block A[6k] corresponds to the first set of two-way interleaved RS symbols, and block A[6k+1] represents the next two-way interleaved RS symbols after the first set of two-way interleaved RS symbols. For the purpose of six-way interleaving as shown, the interleaving delay lanes 903 have different amounts of delay (e.g., 120 units for A[6k] and no delay for A[6k+5]). Note that there is a delay of 120 units for A[6k], whereas delay is 30 units for A[6k] in FIG. 7, and the difference is due to different data communication modes (i.e., two-way 100G vs. 400G). Output 903 provides an interleaved data stream ready for Hamming encoding that follows, and the payload for Hamming encoding is (A[6k−720], A[6k−575], A[6k−430], A[6k−285], A[6k−140], A[6k+5]).

FIG. 10 is a simplified diagram illustrating a one-way interleaving mechanism for a 100G communication interface according to an embodiment of the present invention. This diagram is merely an example, which should not unduly limit the scope of the claims. One of ordinary skill in the art would recognize many variations, alternatives, and modifications. Interleaver 1000 performs convolutional interleaving process with 12 data lanes with varying delays, and the delays are predetermined based on data rate for 100G communication (with one-way interleaved KP4 FEC lane). A single data stream with RS symbols is received at input 901, which distributes the received data stream 12-ways into delay lanes 1002. In various embodiments, input 1001 distributes RS symbols in 10-bit blocks (each RS symbol is 10 bits) to the 12 delay lanes as shown. For example, the 10-bit blocks of RS symbols are represented by A[M]. For example, block A[12k] corresponds to a first RS symbol, and block A[12k+1] represents the next RS symbol after the first RS symbol. For the purpose of 12-way interleaving as shown, the interleaving delay lanes 12 have different amounts of delay (e.g., 132 units for A[12k] and no delay for A[12k+11]). Note that there is a delay of 132 units for A[12k], whereas delay is 30 units for A[6k] in FIG. 7, and the difference is due to different data communication modes (i.e., one-way 100G vs. 400G). Output 1003 provides an interleaved data stream ready for Hamming encoding that follows.

Hamming codewords can be decoded in various ways. At the transmission side, encoding (e.g., Hamming encoding) is performed on an interleaved RS encoded data stream with Hamming codewords. For example, the decoding input includes a syndrome value, and overall parity check, and LLRs. For example, LLRs indicate reliability information associated with each bits of the decoding input. In various embodiments, input and output permutations are embedded in the Hamming decoder. The decoding process relies on the computed syndrome value and the overall parity check bit. In a specific coding scheme, a syndrome value of "0" plus an overall parity check bit of zero indicates that the decoding process is complete and no additional steps are needed. After checking the syndrome value, the decoding process determines whether to terminate early based on the reliability of the bit flip indicated by the non-zero syndrome; otherwise the decoder proceeds to an error map (e.g., selecting between odd number of errors and even number of errors), and the selection of the error map is based on the parity check bit. The selected error map and the syndrome value are used for flipping one or more bits from the hard decoding input, and a candidate codeword is selected (which can be based on the smallest LLR magnitude in a position inverted relative to the hard decoding input). For example, the positions for bit flipping correspond to different combinations of the least reliable received bits.

As described above, the interleaving of Hamming encoded FEC lanes can be performed in various ways. In an example, interleaving involves round-robin distribution of 128-bit Hamming codewords (e.g., over m×25G FEC lanes, m=2 or m=4) to Gray mapper, where 64 consecutive PAM4 UIs originate from a single Hamming-encoded 25G FEC lane. In a different interleaving scheme, each FEC lane (i.e., prior to line distribution), a process of block-interleaving of P consecutive Hamming parity blocks is performed. The process involves writing P Hamming parity blocks row-by-row to a P×128 memory. For example, the process partitions 128-bit rows into eight 20-bit columns and one 8-bit column. When accessing, data are read out column-by-column. For line distribution, round-robin distribution is performed over "units of" P 128-bit Hamming parity blocks per FEC lane. For example, 64×P consecutive PAM4 UIs originate from the P-way interleaved Hamming parity blocks from a single FEC lane. It is to be understood that other variations as possible as well. For example, RS symbol interleaving depth (on line) can be improved by cyclically shifting Hamming payloads (e.g., performed after Hamming encoding) on 20-bit boundaries.

At the receiving end, an important aspect is data synchronization. In various embodiments, the synchronization process is equivalent to determining the boundaries of the Hamming parity blocks. Depending on the implementation, various types of the line distributors can be used. For a round-robin line-distribution implementation, alignment to 64 UI Hamming parity block boundaries can be determined by searching over 64 positions in the received PAM4 signal. For each candidate position, a Hamming syndrome calculator is used in an attempt to "lock" to code block boundaries. In an exemplary embodiment, an FEC block synchronization state machine searches for a programmable number T of zero-syndrome received codewords in a window of N codewords. If misaligned, probability of zero syndrome is 1/256. If correctly aligned and input bit error rate (BER) was 3E-2 (e.g., SNR=11.85 dB; about 3 dB less than an SFEC threshold), the probability of zero errors is about 1/50. In a situation where the SNR is 13.9 dB, the probably of zero error is about 1/4; when SNR is 12.9 dB, the probability of zero error is about 1/14. Once Hamming lock is obtained, convolutional de-interleaver (CDi) lock is implied. The latency characteristics of convolutional interleaver and convolutional de-interleaver are the main contributors to end-to-end latency, wherein the Hamming encoding and decoding processes contribute a relatively small amount of latency.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A communication device for interleaving a first encoded data stream received from a host device, the communication device comprising:
  a first alignment circuit configured to (i) receive the first encoded data stream from the host device, wherein the first encoded data stream includes a plurality of symbols encoded with a first type of error correction code, and (ii) output an aligned first encoded data stream that is aligned to boundaries between the plurality of symbols encoded with the first type of error correction code;

an interleaver configured to interleave the plurality of symbols of the aligned first encoded data stream into symbol sections each including a predetermined number of symbols encoded with the first type of error correction code;

an encoder configured to generate, for each of the symbol sections, a parity block corresponding to the symbols in the symbol section and to output a second encoded data stream including the aligned first encoded data stream and the parity block; and a distribution block configured to distribute a plurality of the second encoded data streams to respective pulse amplitude modulation (PAM) physical channels.

2. The device of claim 1 wherein the first encoded data stream comprises alignment markers between blocks of the plurality of symbols.

3. The device of claim 1 further comprising a mapper for mapping the second encoded data streams to PAM4 format, wherein each of the second encoded data streams corresponds to a distinct 25G FEC data stream.

4. The device of claim 1 wherein respective symbols among the plurality of symbols has 10 bits.

5. The device of claim 4 wherein respective symbol sections includes 12 Reed Solomon (RS) symbols.

6. The device of claim 5 wherein the RS symbols of the first encoded data stream are two-way interleaved, the interleaver is configured to perform six-way interleaving, the 12 RS symbols are from 12 distinct RS codewords, and the second encoded data stream includes the 12 RS symbols and a Hamming parity block.

7. The device of claim 1 wherein the plurality of second encoded data streams are associated with independent alignments.

8. The device of claim 1 wherein encoded data streams defining the plurality of second encoded data streams are distributed to the PAM physical channels according to a round-robin scheme.

9. The device of claim 1 wherein the interleaver comprises n or n/2 delay lines, wherein n is an integer.

10. The device of claim 1 further comprising m alignment circuits, the m alignment circuits including the first alignment circuit, wherein m is an integer.

11. The device of claim 1 wherein the interleaves is configured to perform 12-way interleaving to interleave 12 of the symbols into a block.

12. A method for encoding a data stream, the method comprising:

receiving a first encoded data stream, the first encoded data stream comprising a plurality of encoded symbols each having boundaries with respect to others of the encoded symbols, the encoded symbols being encoded with an error correction code;

aligning the first encoded data stream to the boundaries of the encoded symbols to generate a first aligned symbol stream;

interleaving the first aligned symbol stream into symbol sections, each of the symbol sections including n of the encoded symbols encoded with the error correction code;

performing a first type of FEC encoding on the first aligned symbol stream to generate a first FEC encoded stream, the first FEC encoded stream including first FEC blocks corresponding to each of the symbol sections; and distributing m FEC encoded streams to k physical channels, the m FEC encoded streams including the first FEC encoded stream, wherein n, m, and k are integers.

13. The method of claim 12 wherein the first type of FEC encoding comprises Hamming encoding of the first aligned symbol stream.

14. The method of claim 12 wherein the first type of FEC encoding comprises BCH encoding of the first aligned symbol stream.

15. The method of claim 14, wherein the BCH encoding is characterized by a payload of n*10 bits.

16. The method of claim 12 further comprising mapping the m inner FEC encoded streams to PAM4 format.

17. The method of claim 12 wherein the interleaving comprises convolutional interleaving configured interleave the first aligned symbol stream into Reed Solomon (RS) symbol sections.

* * * * *